United States Patent
Pun et al.

[19]

[11] Patent Number: 6,087,843
[45] Date of Patent: Jul. 11, 2000

[54] INTEGRATED CIRCUIT TESTER WITH TEST HEAD INCLUDING REGULATING CAPACITOR

[75] Inventors: Henry Yu-Hing Pun, Santa Clara; Jeffrey D. Currin, Pleasanton, both of Calif.; Michael R. Ferland, Tualatin, Oreg.

[73] Assignee: Credence Systems Corporation, Fremont, Calif.

[21] Appl. No.: 08/892,353

[22] Filed: Jul. 14, 1997

[51] Int. Cl.⁷ .................................................. G01R 31/26
[52] U.S. Cl. .................................... 324/765; 324/158.1
[58] Field of Search .................................. 324/765, 158.1

[56] References Cited

U.S. PATENT DOCUMENTS

| | | | |
|---|---|---|---|
| 5,392,293 | 2/1995 | Hsue ................................. | 324/158.1 X |
| 5,541,553 | 7/1996 | Chujo et al. ........................ | 324/765 X |
| 5,721,495 | 2/1998 | Jennion et al. ......................... | 324/765 |
| 5,731,700 | 3/1998 | McDonald ............................ | 324/158.1 |
| 5,789,933 | 8/1998 | Brown et al. ........................... | 324/765 |

*Primary Examiner*—Josie Ballato
*Assistant Examiner*—T. R. Sundaram
*Attorney, Agent, or Firm*—Smith-Hill and Bedell

[57] ABSTRACT

Current consumption of a device under test (DUT) is measured using a tester including a device power supply (DPS) having force and return lines terminating in respective power supply terminals. The DUT is removably received by a load board having contact elements which are in electrically conductive pressure contact with the power supply terminals of the force and return lines and are connected to power supply pins of the DUT. A circuit branch including a bypass capacitor and an nMOSFET is connected between the force and return lines.

1 Claim, 2 Drawing Sheets

INTEGRATED CIRCUIT TESTER WITH TEST HEAD INCLUDING REGULATING CAPACITOR

BACKGROUND OF THE INVENTION

This invention relates to an integrated circuit tester with a test head including a regulating capacitor.

An integrated circuit tester is used to predict how an integrated circuit device will behave in operation. A typical integrated circuit tester includes a test head having multiple tester modules, each of which has a signal terminal. Each tester module includes pin electronics circuitry which operates the module selectively in one of several operating modes, which typically include drive high, drive low, compare high and compare low. In the drive high mode, for example, the circuitry applies a logic high signal to the signal terminal, whereas in the compare low mode, the circuitry compares the voltage at the signal terminal with a low threshold value. In order to carry out a test, the test head is positioned with the signal terminals of the tester modules in contact with respective signal I/O pads of a load board. The load board provides a parallel electrical interface between the signal terminals of the tester modules and signal pins of the device under test (DUT).

The tester includes a device power supply (DPS) having force and return terminals connected through the load board to respective power supply pins of the DUT to supply operating current to the DUT. A test is executed in a succession of cycles, and for each cycle of the test, each tester module is placed in a selected one of its predetermined operating modes. In this manner, the DUT is exercised through a sequence of internal states, and the nature of the output of the DUT in each state is observed. In the case of a complex DUT, there may be many thousands of test cycles and therefore the testing can take a long time.

Two aspects of testing of an integrated circuit device are functional testing and quiescent current testing. The purpose of functional testing is to determine whether the DUT provides the expected output in each state. The purpose of quiescent current testing is to detect anomalies in current consumption by measuring the current drawn by the DUT in steady state, when there are no changes in state occurring. In a high speed functional test, the DPS may supply several amps of current, whereas a much smaller current is drawn during quiescent current testing.

FIG. 3 illustrates schematically a tester and a load board configured for measuring quiescent current drawn by a DUT 10. A DPS 12 for supplying operating current to the DUT includes a power supply amplifier 14 whose output is connected through a current sensing resistor 16 to the $V_{DD}$ terminal of the DUT. A differential amplifier 18 is connected across the sensing resistor and provides an output signal representative of the current flowing through the resistor. A bypass capacitor 20 is connected between the force and return lines of the DPS 12 to regulate the voltage applied to the power supply pins of the DUT. The tester includes multiple tester modules 22, only one of which is shown, connected to respective signal pins of the DUT.

In order to carry out a functional test, the test modules exercise the DUT through a sequence of states and acquire data indicating the behavior of the DUT in each state, as mentioned above. In order to measure quiescent current, the DUT must first be sensitized to a particular target state. In general, this is accomplished by using the tester modules to apply signals to the DUT and thereby advance the DUT through a pattern of states until the target state is reached. During sensitizing of the DUT, substantial current may be drawn as the DUT changes state. When the DUT has been sensitized to the target state, the current drawn by the DUT is measured by digitizing the output signal of the differential amplifier 18.

In order to regulate the voltage adequately during the functional test and during sensitizing of the DUT to its target state, the bypass capacitor 20 should normally have a capacitance C of from 10 to 100 $\mu$F. However, a bypass capacitance of less than one percent of C will generally be sufficient to regulate the voltage during a quiescent current measurement. If the quiescent current is measured with a large bypass capacitance, the bypass capacitance will introduce substantial current noise in the current measurement circuit.

Before measuring quiescent current, it is necessary to allow the current to settle to a steady value. The settling time depends on the capacitance between the force and return lines of the DPS. Accordingly, use of a large bypass capacitance increases the time taken to carry out a quiescent current test.

FIG. 4 illustrates a tester which avoids some of the disadvantages of the tester shown in FIG. 3. In accordance with FIG. 4, a capacitor 26 of fairly small capacitance C1 (e.g. 0.1 $\mu$F) is connected between the force and return lines and a circuit branch consisting of an electromechanical relay switch 28 and a capacitor 30 of substantially larger capacitance C2 (e.g. 10 to 100 $\mu$F), connected in series, is connected in parallel with the capacitor 26. In order to carry out a functional test or sensitize the DUT, the electromechanical relay switch 28 is closed and accordingly the bypass capacitance is (C1+C2), whereas in order to measure the quiescent current the relay switch 28 is opened and the capacitor 30 is taken out of circuit so that the bypass capacitance is C1.

A thorough test of a complex integrated circuit device would involve quiescent current testing in thousands of states. The time for switching the relay 28 may be as long as 50 ms, depending on the size of the relay which, in turn, depends on the maximum current drawn by the DUT. The switching time is such that it is impractical to measure quiescent current at each pertinent state of the device and accordingly it has hitherto been conventional to measure quiescent current at relatively few states. There is therefore a significant danger that an anomaly in quiescent current will not be detected, and a defective device might not be discovered.

Generally, each different design of integrated circuit device to be tested requires a different load board to interface with the tester, and consequently the cost of the load board can be a significant component of the cost of testing a device. The large capacitance bypass capacitor 30 is typically a ceramic capacitor and is therefore expensive. Further, the electromechanical relay switch 28 also is expensive. Since the relay switch 28 and the capacitor 30 are mounted on the load board, the cost of the relay switch and the ceramic capacitor is a component of the cost of the load board and consequently, the cost of test of a particular device.

A VLSI tester may be able to test a device having more than one thousand pins. However, many devices have only several hundred pins, and it may be desirable to test multiple devices concurrently by designing the load board to provide connections to multiple devices.

The load board is carried by a displacement mechanism, such as a wafer prober or a device handler, which displaces the load board to and from the position in which the signal I/O pads of the load board contact the signal terminals of the tester modules. The physical structure of the displacement mechanism, and the need to avoid collision between the load board and other components of the tester as the displacement mechanism displaces the load board, imposes a limit on the size of the load board and hence on the space available on the load board to support multiple devices.

If the arrangement shown in FIG. 4 is used to test multiple devices concurrently, there must be an electromechanical switch 28 and a capacitor 30 on the load board for each DUT. The electromechanical relay switch 28 and the ceramic capacitor 30 are bulky and therefore placing them on the load board limits the space available in the load board for devices to be tested.

It is desirable that the contact pads on the load board be brought as close as possible to the test head in order to minimize the uncompensated inductance of conductors, such as pogo pins, connecting the test head to the load board. Since the capacitor 30 and the electromechanical relay switch are bulky, the presence of these components on the load board establishes a minimum spacing of the load board from the test head.

The manufacturer of the tester generally cannot control the choices made by the user of the tester in manufacture of the load board. If the user selects an unsuitable capacitance value for the capacitor 30, the validity of the test results provided by the tester may be impaired. Also, if the user makes an unsuitable choice in the location of the capacitor 30 and the electromechanical relay switch 28 on the load board, the validity of the test results may be impaired.

SUMMARY OF THE INVENTION

According to a first aspect of the present invention there is provided apparatus for measuring current consumption of a device under test (DUT), comprising a power supply having force and return terminals for connection to the DUT to supply electrical current to the DUT, and a circuit branch connected between the force and return terminals of the power supply, said circuit branch including a capacitor and a semiconductor switch which has a controlled current path between a first electrode connected to the capacitor and a second electrode connected to one of said terminals and also has a control electrode, wherein the controlled current path is in a high impedance state when the control electrode is at substantially the same potential as the second electrode and is in a low impedance state when the control electrode is at a predetermined potential different from that of the second electrode.

According to a second aspect of the present invention there is provided apparatus for measuring current consumption of a device under test (DUT), comprising a power supply having first and second terminals for connection to the DUT to supply electrical current to the DUT, one of said first and second terminals being a positive terminal and the other of said first and second terminals being a negative terminal, and a circuit branch connected between the first and second terminals of the power supply, said circuit branch including a capacitor and an enhancement mode MOSFET having first, second and third electrodes, the first electrode being a gate electrode, one of the second and third electrodes being a source electrode and the other of the second and third electrodes being a drain electrode, one terminal of the capacitor being connected to the second electrode of the MOSFET, the other terminal of the capacitor being connected to the first terminal of the power supply, and the third electrode of the MOSFET being connected to the second terminal of the power supply.

According to a third aspect of the present invention there is provided apparatus for measuring current consumption of a device under test (DUT), comprising a test head including a power supply having force and return lines terminating in respective power supply terminals and also including a circuit branch connected between said force and return lines, said circuit branch including a capacitor and a switch which has conductive state in which the capacitor is electrically connected between the force and return lines and a non-conductive state in which the capacitor is electrically isolated from at least one of said lines, and a load board for removably receiving the DUT, the load board having contact elements connected to power supply pins of the DUT and in electrically conductive pressure contact with said power supply terminals.

According to a fourth aspect of the present invention there is provided a method of measuring current consumption of an integrated circuit device under test (DUT), comprising the steps of providing a power supply having force and return terminals, there being a circuit branch connected between the force and return terminals, said circuit branch including a capacitor and a semiconductor switch which has a controlled current path between a first electrode connected to the capacitor and a second electrode connected to one of said terminals and also has a control electrode, wherein the controlled current path is in a high impedance state when the control electrode is at substantially the same potential as the second electrode and is in a low impedance state when the control electrode is at a predetermined potential different from that of the second electrode, connecting power supply pins of the DUT to the force and return terminals respectively of the power supply circuit, switching the semiconductor switch to its low impedance state, sensitizing the DUT to a target state, switching the semiconductor switch to its high impedance state, measuring current consumed by the DUT while holding the DUT in said target state, and switching the semiconductor switch back to its low impedance state.

BRIEF DESCRIPTION OF THE DRAWINGS

For a better understanding of the invention, and to show how the same may be carried into effect, reference will now be made, by way of example, to the accompanying drawings, in which.

In the several figures of the drawings, like reference numerals designate corresponding elements.

DETAILED DESCRIPTION

Figure 1:
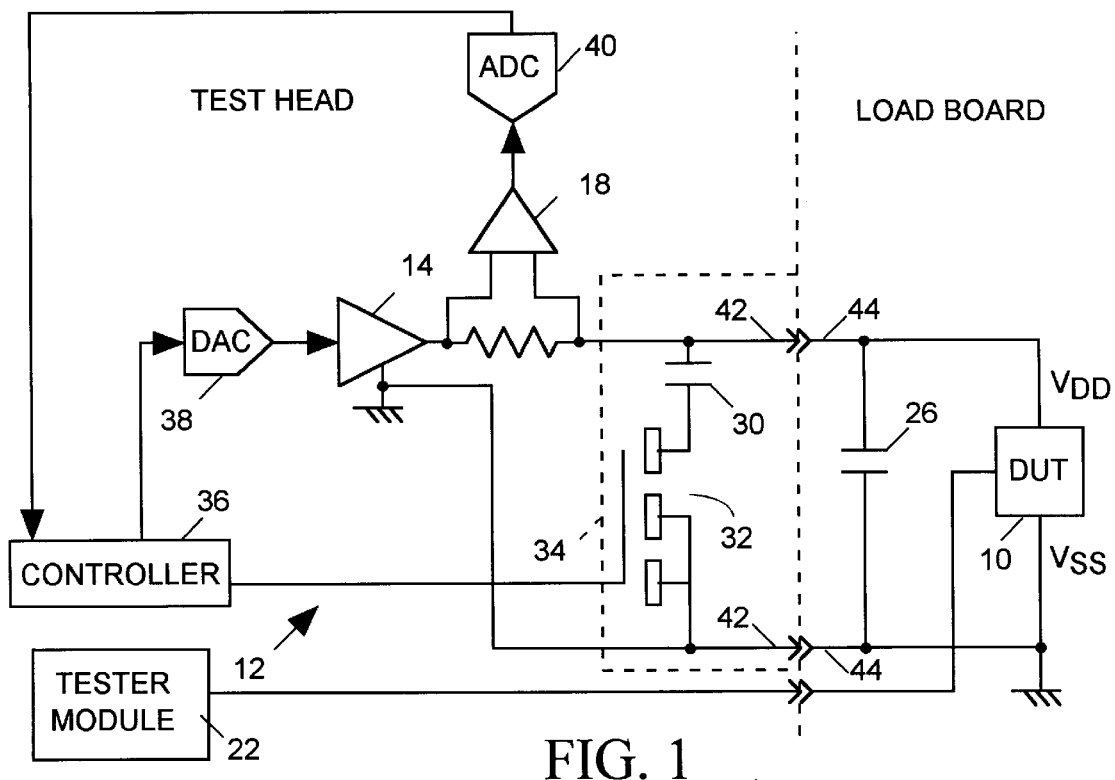
FIG. 1 is a partial schematic block diagram illustrating a first integrated circuit tester in accordance with the present invention.

In the tester shown in FIG. 1, the capacitor 30 is connected in series with a semiconductor switch 32 between the force and return lines of the DPS 12. The switch 32 is implemented by an enhancement mode nMOSFET having its drain connected to the capacitor 30 and its source connected to the return line of the DPS 12. An enhancement mode nMOSFET has the characteristic that it is turned on (rendered conductive) by applying a positive turn on voltage to its gate relative to its source and, when on, has a low resistance, whereas it is turned off (rendered nonconductive) by holding its gate at about zero volts relative to its source; and the state of an enhancement mode MOSFET can be changed very rapidly, e.g. in 1–2 ps.

The state of the switch 32 is controlled by a controller 36 incorporated in the DPS. The controller 36 also supplies a digital signal to a digital-to-analog converter (DAC) 38 and thereby controls the voltage forced by the power supply amplifier 14. The output voltage of the differential amplifier 18 is digitized by an analog-to-digital converter (ADC) 40, and the digital signal representing the measured value of current is supplied to the controller 36.

During sensitizing of the DUT 10 to a target state, the controller 36 closes the switch 32 (holds the MOSFET in the on state) so that the capacitor 30 is connected in parallel with the capacitor 26. The capacitors 26 and 30 are charged to the output voltage of the DPS 12 and regulate the voltage applied to the DUT during sensitizing of the DUT to the target state. During sensitizing of the DUT, the digital signal provided to the controller 36 by the ADC 40 is representative of $I_{DDdynamic}$. When the DUT has been sensitized to the desired target state, the controller 36 opens the switch 32 (turns the MOSFET off), by holding the gate of the MOSFET at zero volts relative to its source. Accordingly, the capacitor 30 is switched out of circuit and the settling time and the noise current are not dependent on the capacitance of the capacitor 30. Since the source, gate and drain of the MOSFET are all at approximately the same voltage, there will be very little leakage current from the circuit branch including the capacitor 30 and the MOSFET to contribute to the measurement error. Once the quiescent current has been measured, the MOSFET is turned on again, by applying a turn on voltage across its gate and source, and the capacitor 30 is switched back into circuit.

The capacitor 30 and the switch 32 are mounted on an interconnection module 34, which is included in the test head but is distinct from the tester modules 22. The interconnection module 34 has an array of pogo pins 42 in electrically conductive pressure contact with respective contact pads 44 on the load board. The force line of the DPS is connected to one group of pogo pins and the load board contacts engaged by that group of pogo pins are connected in common to the $V_{DD}$ power supply pin of the DUT, and similarly the return line is connected to another group of pogo pins and the load board contacts engaged by that group of pogo pins are connected in common to the $V_{SS}$ power supply pin of the DUT.

Since the DPS 12 forces a positive voltage and its force line is connected to the $V_{DD}$ power supply pin of the DUT, the digital signal supplied to the controller 36 by the ADC 40 during a quiescent current measurement is representative of $I_{DDQ}$ and is not affected by a leakage current component of $I_{SS}$.

Figure 2:
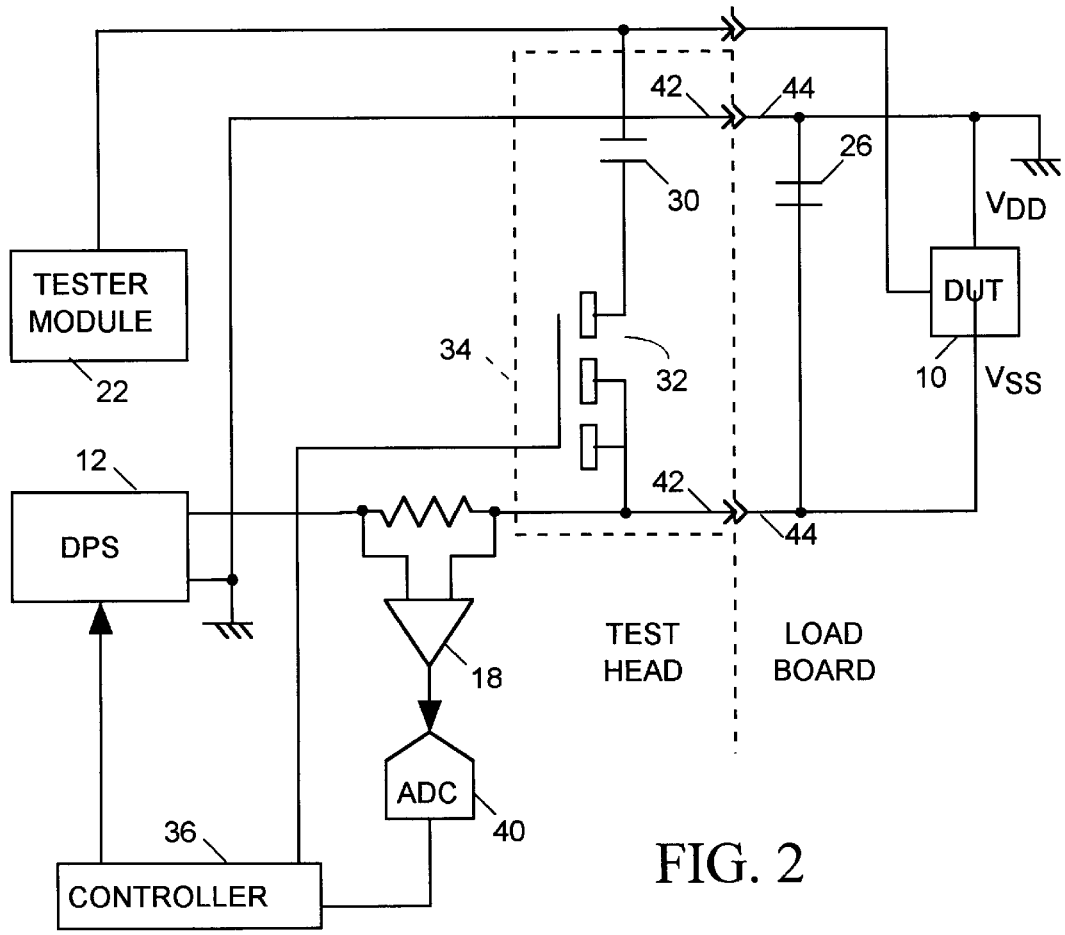
FIG. 2 is a partial schematic block diagram illustrating a second integrated circuit tester in accordance with the present invention.
Figure 3:
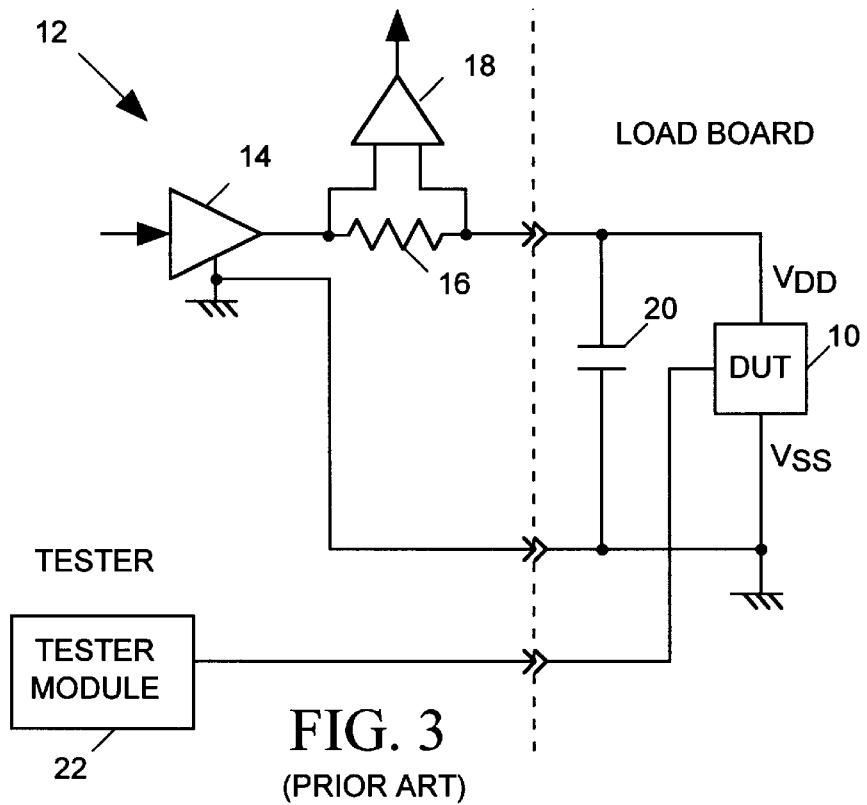
FIG. 3 is a partial schematic block diagram illustrating a first integrated circuit tester in accordance with the prior art.
Figure 4:
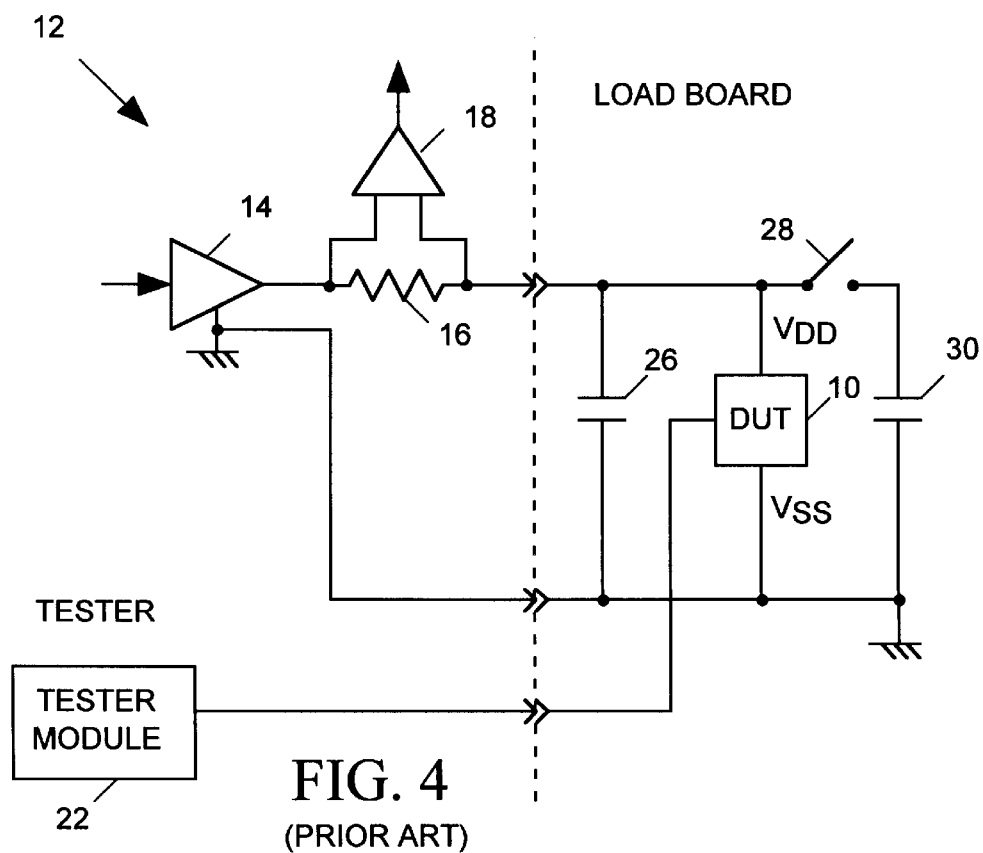
FIG. 4 is a partial schematic block diagram illustrating a second integrated circuit tester in accordance with the prior art.

The arrangement shown in FIG. 2 is similar to that shown in FIG. 1 except that the DPS 12 forces a negative voltage, which is applied to the $V_{SS}$ pin of the DUT. During a quiescent current measurement the digital signal supplied by the ADC 40 is representative of $I_{SSQ}$ and is not affected by a leakage current component of $I_{DD}$.

Since the expensive capacitor 30 is part of the tester rather than part of the load board, the cost of the capacitor 30 can be spread over testing of multiple different load boards, reducing the cost of test per device. Further, incorporation of the capacitor 30 in the tester leaves space on the load board, which facilitates concurrent testing of multiple devices and also renders the spacing of the load board from the test head independent of the size of the capacitor.

By including the capacitor 30 and the switch 32 in the tester, the tester manufacturer is able to exercise tight control over the capacitance of the capacitor 30 and over the location of the capacitor 30 and switch 32, including path lengths, and generally over the dynamic performance of the components that would otherwise be mounted on the load board but are now in the interconnection module.

By avoiding the need for the electromagnetic relay switch, the time taken for carrying out a quiescent current measurement is reduced and this allows more comprehensive, and hence higher quality, testing.

It will be appreciated that the invention is not restricted to the particular embodiments that have been described, and that variations may be made therein without departing from the scope of the invention as defined in the appended claims and equivalents thereof. For example, although the invention has been described with reference to use of an enhancement mode nMOSFET as a semiconductor switch between the capacitor 30 and the negative line of the DPS 12, it would instead be possible to use an enhancement mode pMOSFET, connected between the capacitor and the positive line of DPS 12.

What is claimed is:

1. Apparatus for measuring current consumption of a device under test (DUT), comprising:

a power supply having first and second terminals for connection to the DUT to supply electrical current to the DUT, said first and second terminals being of first and second polarities respectively, and a circuit branch connected between the first and second terminals of the power supply, said circuit branch including a capacitor and an enhancement mode MOSFET in which charge carriers are of said second polarity and which has first, second and third electrodes, the first electrode being a gate electrode, one of the second and third electrodes being a source electrode and the other of the second and third electrodes being a drain electrode, one terminal of the capacitor being connected to the second electrode of the MOSFET, the other terminal of the capacitor being connected to the first terminal of the power supply, and the third electrode of the MOSFET being connected to the second terminal of the power supply.

* * * * *